United States Patent [19]

Kunioka

[11] Patent Number: 6,055,368
[45] Date of Patent: Apr. 25, 2000

[54] BATCH EXECUTION CONTROL PROGRAMMING DEVICE AND METHOD

[75] Inventor: Michiko Kunioka, Tokyo, Japan

[73] Assignee: Mitsubishi Denki Kabushiki Kaisha, Tokyo, Japan

[21] Appl. No.: 08/685,688

[22] Filed: Jul. 24, 1996

[30] Foreign Application Priority Data

Mar. 19, 1996 [JP] Japan ................................. 8-063039

[51] Int. Cl.[7] ................................................. G06F 17/50
[52] U.S. Cl. .............................. 395/500.34; 395/500.2; 395/702
[58] Field of Search ............................. 395/500, 500.01, 395/500.02, 500.34, 702; 364/578, 488–491

[56] References Cited

U.S. PATENT DOCUMENTS

| | | | |
|---|---|---|---|
| 5,248,924 | 9/1993 | Niwa | 318/569 |
| 5,291,416 | 3/1994 | Hutchins | 364/474.16 |
| 5,291,595 | 3/1994 | Martins | 395/600 |
| 5,305,450 | 4/1994 | Naito et al. | 395/500 |

FOREIGN PATENT DOCUMENTS

406337902 12/1994 Japan .

OTHER PUBLICATIONS

Camara et al., "Tool mamagement in an electronic CAD framework," Circuits and Systems, 1995: ISCAS '95 IEEE Int. Symp., vol. 2, Apr.–May 1995, pp. 928–932.

Sienicki et al., "Graphical methodology language for CAD frameworks," VLSI Design, 1994: Proc. of 7th Int. Conf., Jan. 1994, pp. 401–406.

Madhavji et al., "Adapting modules to an integrated programming environment," Computer Languages, 1988: Proc. of Int. Conf., Oct. 1988, pp. 364–371.

Kupitz et al., "DECOR–tightly integrated design control and observation," Computer–Aided Design, 1992: ICCAD–92 Dig. of Tech. Papers IEEE/ACM Int. Conf., Nov. 1992, pp. 532–537.

Chiueh et al., "A history model for managing the VLSI design process," Computer–Aided Design, 1990: ICCAD–90 Dig. of Tech. Papers IEEE Int. Conf., Nov. 1990, pp. 358–361.

Primary Examiner—Kevin J. Teska
Assistant Examiner—Kyle J. Choi
Attorney, Agent, or Firm—Burns, Doane, Swecker & Mathis, LLP

[57] ABSTRACT

A batch execution control programming device for creating a batch execution control program without taking a lot of time is obtained. A processing system reads (or inputs) an environment definition file, a user interface definition file, a parameter definition file, an invocation command definition file and a control command file, and generates a batch execution control program. The user interface definition file, the parameter definition file and the invocation command definition file provide the description for defining the contents of a processing for tool encapsulation which are changed according to the specification for tool encapsulation. The environment definition file determines whether the contents of processings of the files are executed according to the characteristics of a tool or not.

11 Claims, 27 Drawing Sheets

LOGIC DESIG, LOGIC ENTRY — S21
PRELAYOUT SIMULATION — S22
LAYOUT — S23
POSTLAYOUT SIMULATION — S24
TEST SIMULATION — S25
TEST DATA GENERATION — S26

```
                                                   6
EncapFormDef     ="DelayCalculationPostsim"
EncapParmDef     ="DelayCalculationPostsim"
EncapInvokeDef   ="DelayCalculationPostsim"

EncapLogFile     ="DelayCalculationPostsim.log"
```

FIG. 8

```
"Delay Calculation for sim"
①  (string     module
    prompt     "Module Name"
    value      gd_module
    editable   nil)
②  (string     simdir
    prompt     "Sim Data Directory"
    value      gd_simdir
    editable   nil)
③  (string     tool
    prompt     "Target Simulator"
    value      "xxsim"
    editable   nil)
④  (string     dmod
    prompt     "Delay Mode"
    value      "post"
    global     gv_simpost
    editable   nil)
⑤  (string     delaycntl
    prompt     "User Delay Calculation Control File Name"
    value      "none"
    required   t)
⑥  (string     pinchk
    prompt     "User Spike/Hazard Check File Name"
    value      "none"
    required   t)
⑦  (string     dummypin
    prompt     "User Dummypin File Name"
    value      "none"
    required   t)
⑧  (radio      dmodel
    prompt     "Delay Calculation Model"
    choices    ("C" "RC")
    value      "C"
    global     gv_simdmodel)
⑨  (cyclic     runnode
    prompt     "Run Node"
    choices    gv_runnode_list
    global     gv_runnode)
```
— 3

```
-global     EncapBaseRunDir / .global
-tool       EncapFormHandle->tool
-dmod       EncapFormHandle->dmod
-basedir    EncapBaseRunDir
-delaycntl  EncapFormHandle->delaycntl
-pinchk     EncapFormHandle->pinchk
-dummypin   EncapFormHandle->dummypin
-dmodel     EncapFormHandle->dmodel
```

```
delaycalc.sh -rundir EncapRunDir   -parmfile EncapParmDef .parn
```

FIG. 11

```
* Read only field *
① Module Name    : LSITOP
② Sim Data Directory   : simdir
③ Target Simulator : xxsim
④ Delay Mode : post
*** Please input field data ***
⑤ User Delay Calculation Control File Name (Previous Value: none) :
⑥ User Spike/Hazard Check File Name (Previous Value: none) :
⑦ User Dummypin File Name (Previous Value: none) :
     ⎡Delay Calculation Model (Previous Value: C)
     │ 1.C
  ⑧ ⎨ 2.RC
     ⎣Please select number. : 1
*** Please checking your input data ***
User Delay Calculation Control File Name         : none
User Spike/Hazard Check File Name         : none
User Dummypin File Name         : none
Delay Calculation Model         : C
OK? (yes/cancel/no) : yes
```

FIG. 12

```
"Delay Calculation for sim"                                          3B
     ┌ (string    module
  ①  │   prompt     "Module Name"
     │   value      gd_module
     └   editable   nil)
     ┌ (string    simdir
  ②  │   prompt     "Sim Data Directory"
     │   value      gd_simdir
     └   editable   nil)
     ┌ (string    tool
  ③  │   prompt     "Target Simulator"
     │   value      "xxsim"
     └   editable   nil)
     ┌ (string    dmod
     │   prompt     "Delay Mode"
  ④  │   value      "pre"
     │   global     gv_simpost
     └   editable   nil)
     ┌ (string    delaycntl
  ⑤  │   prompt     "User Delay Calculation Control File Name"
     │   value      "none"
     └   required   t)
     ┌ (string    pinchk
  ⑥  │   prompt     "User Spike/Hazard Check File Name"
     │   value      "none"
     └   required   t)
     ┌ (string    dummypin
  ⑦  │   prompt     "User Dummypin File Name"
     │   value      "none"
     └   required   t)
     ┌ (cyclic    runnode
  ⑨  │   prompt     "Run Node"
     │   choices    gv_runnode_list
     └   global     gv_runnode)
```

FIG. 13

```
"Delay Calculation for sim"                                    ─3A
   ┌ (string    module
 ① │   prompt    "Module Name"
   │   value     gd_module
   └   editable  nil)
   ┌ (string    simdir
 ② │   prompt    "Sim Data Directory"
   │   value     gd_simdir
   └   editable  nil)
   ┌ (string    tool
 ③ │   prompt    "Target Simulator"
   │   value     "xxsim"
   └   editable  nil)
   ┌ (string    dmod
   │   prompt    "Delay Mode"
 ④ │   value     "post"
   │   global    gv_simpost
   └   editable  nil)
   ┌ (string    delaycntl
 ⑤ │   prompt    "User Delay Calculation Control File Name"
   │   value     "none"
   └   required  t)
   ┌ (string    pinchk
 ⑥ │   prompt    "User Spike/Hazard Check File Name"
   │   value     "none"
   └   required  t)
   ┌ (string    dummypin
 ⑦ │   prompt    "User Dummypin File Name"
   │   value     "none"
   └   required  t)
     (radio     dmodel
   ┌   prompt    "Delay Calculation Model"
 ⑧ │   choices   ("C" "RC")
   │   value     "C"
   └   global    gv_simdmodel)
   ┌ (cyclic    runnode
 ⑨ │   prompt    "Run Node"
   │   choices   gv_runnode_list
   └   global    gv_runnode)
```

FIG. 14

```
"Delay Calculation for sim"                              3C
  ┌ (string     module
① │   prompt    "Module Name"
  │   value     gd_module
  └   editable  nil)
  ┌ (string     simdir
② │   prompt    "Sim Data Directory"
  │   value     gd_simdir
  └   editable  nil)
  ┌ (string     tool
③ │   prompt    "Target Simulator"
  │   value     "xxsim"
  └   editable  nil)
  ┌ (string     dmod
  │   prompt    "Delay Mode"
④ │   value     "test"
  │   global    gv_simpost
  └   editable  nil)
  ┌ (string     pinchk
⑥ │   prompt    "User Spike/Hazard Check File Name"
  │   value     "none"
  └   required  t)
  ┌ (string     dummypin
⑦ │   prompt    "User Dummypin File Name"
  │   value     "none"
  └   required  t)
    (radio      dmodel
  ┌   prompt    "Delay Calculation Model"
⑧ │   choices   ("C" "RC")
  │   value     "C"
  └   global    gv_simdmodel)
  ┌ (cyclic     runnode
⑨ │   prompt    "Run Node"
  │   choices   gv_runnode_list
  └   global    gv_runnode)
```

* Read only field *
① Module Name      : LSITOP
② Sim Data Directory   : simdir
③ Target Simulator : xxsim
*** Please input field data ***
④ Delay Mode (Previous Value: post) : pre
⑤ User Delay Calculation Control File Name (Previous Value: none) :
⑥ User Spike/Hazard Check File Name (Previous Value: none) :
⑦ User Dummypin File Name (Previous Value: none) :

*** Please checking your input data ***
Delay Mode                         : pre
User Delay Calculation Control File Name      : none
User Spike/Hazard Check File Name             : none
User Dummypin File Name            : none
Delay Calculation Model            : C
OK? (yes/cancel/no) : yes
```

FIG. 19

```
* Read only field *
① Module Name      : LSITOP
② Sim Data Directory   : simdir
③ Target Simulator : xxsim
*** Please input field data ***
④ Delay Mode (Previous Value: post) :
⑤ User Delay Calculation Control File Name (Previous Value: none) :
⑥ User Spike/Hazard Check File Name (Previous Value: none) :
⑦ User Dummypin File Name (Previous Value: none) :
   ⎧Delay Calculation Model (Previous Value: C)
⑧ ⎨ 1.C
   ⎩ 2.RC
   ⎣Please select number. : 1
*** Please checking your input data ***
Delay Mode                    : post
User Delay Calculation Control File Name         : none
User Spike/Hazard Check File Name         : none
User Dummypin File Name       : none
Delay Calculation Model       : C
OK? (yes/cancel/no) : yes
```

* Read only field *
① Module Name     : LSITOP
② Sim Data Directory   : simdir
③ Target Simulator : xxsim
*** Please input field data ***
④ Delay Mode (Previous Value: post) : test
⑥ User Spike/Hazard Check File Name (Previous Value: none) :
⑦ User Dummypin File Name (Previous Value: none) :
    ⎧Delay Calculation Model (Previous Value: C)
  ⑧⎨ 1.C
    ⎩ 2.RC
     Please select number. : 1
*** Please checking your input data ***
Delay Mode                    : test
User Delay Calculation Control File Name        : none
User Spike/Hazard Check File Name               : none
User Dummypin File Name             : none
Delay Calculation Model             : C
OK? (yes/cancel/no) : yes
```

FIG. 21

```

declare dmod;

delaycntl
(dmod == pre  || dmod == post);

pinchk
(dmod == pre  || dmod == post || dmod == test);

dummypin
(dmod == pre  ||  dmod == post  || dmod == test);

dmodel
(dmod == post  || dmod == test);
```

*FIG. 22*

```

Interactive mode

CASE1:
echo"*** Read only field ***"
echo"Module Name       : $module"                         ①
echo"Sim Data Directory       : $simdir"                  ②
echo"Target Simulator  : $tool"                           ③ echo"* Please input field data *"
while(! $?formCheck)
  # Delay Mode
  while(! $?fieldCheck)
    echo -n"Delay Mode (Previous Value: $dmod):"
    set shellgen_input = $<
    if($shellgen_input !="")then
      set dmod = $shellgen_input                          ④
    endif
    set fieldCheck
  end
  unset fieldCheck

# User Delay Calculation Control File Name
  if($dmod == pre || $dmod == post)then
    while (! $?fieldCheck)
      echo -n"User Delay Calculation Control
              File Name (Previous Value: $delaycntl) :"
      set shellgen_input = $<
      if( $shellgen_input !="")then
        set delaycntl = $shellgen_input                   ⑤
      endif
      if("$delaycntl" !="")then
        set fieldCheck
      endif
    end
    unset fieldCheck
  endif

# User Spike/Hazard Check File Name
  if($dmod = pre || $dmod = post || $dmod == test)then
    while(! $?fieldCheck)
      echo -n"User Spike/Hazard Check File Name
              (Previous Value: $pinchk) :"
      set shellgen_input = $<
      if ($shellgen_input !="")then
        set pinchk = $shellgen_input                      ⑥
      endif
      if("$pinchk" !="")then
        set fieldCheck
      endif
    end
    unset fieldCheck
  endif
```

FIG. 23

```
# User Dummypin File Name
if($dmod = pre || $dmod = post || $dmod == test)then
  while (! $?fieldCheck)
    echo -n"User Dummypin File Name
             (Previous Value: $dummypin) :"
    set shellgen_input = $<
    if("$shellgen_input !="")then
      set dummypin = $shellgen_input
    endif
    if("$dummyin"!="")then
      set fieldCheck
    endif
  end
  unset fieldCheck
endif                                                     ⑦

# Delay Calculation Model
if($dmod == post || $dmod == test)then
  while(! $?fieldCheck)
    echo "Delay Calculation Model(Previous Value: $dmodel)"
    echo " 1.C"
    echo " 2.RC"
    echo -n"Plase select number.:"
    set shellgen_input = $<
    switch("$shellgen_input")
      case 1:
        set shellgen_input = "C"
        breaksw
      case 2:
        set shellgen_input = "RC"
        breaksw
      case "":
        set shellgen_input = ""
        breaksw
      default:
        set shellgen_input = ERROR
    endsw
    if("$shellgen_input" !=ERROR)then
      if("$shellgen_input" !="")then
        set dmodel = "$shellgen_input"
      endif
      if("$dmodel"=="C" || "$dmodel"=="RC")then
        set fieldCheck
      endif
    endif
  end
  unset fieldCheck
endif                                                     ⑧
```

```
# ehcoback input datas.
echo""
echo"***Please checking your input data ***"
echo"Delay Mode                     : $dmod"
if($dmod == pre || $dmod = post)then
   echo "User Delay Calculation Control File Name    : $delaycntl"
endif
if($dmod == pre || $dmod == post || $dmod == test)then
   echo "User Spike/Hazard Check File Name    : $pinchk"
endif
if($dmod == pre || $dmod == post || $dmod == test)then
   echo"User Dummypin File Name           : $dummypin"
endif
if($dmod == post || $dmod == test)then
   echo"Delay Calculation Model           : $dmodel"
endif while ( ! $?reqflg)
   echo -n"OK?(yes/cancel/no) :"
   set require = $<
   if($require == yes || $require == YES)then
     set formCheck
   endif
   if($require == cancel || $require == CANCEL)then
     exit 1
   endif
   if($require == no || $require == NO)then
     set reqflg
   endif
end
unset reqflg
end
```

```
SAVE_DE:

Make New shell parmfile

cat << END > sim.parm
-tool           $tool
-dmod           $dmod
-delaycntl              $delaycntl
-pinchk         $pinchk
-dummypin               $dummypin
-dmodel         $dmodel
END

EXEC:

Create EncapRunDir

set shellgen_rundir = simdir if( ! -d $shellgen_rundir)then
   mkdir -p $shellgen_rundir
endif

Create parameter file of program.

set parmfiletmp = DelayCalculationforsim.parm
cat << END > $parmfiletmp
-global         $cwd/.global
-tool           $tool
-dmod           $dmod
-basedir            $cwd
-delaycntl              $delaycntl
-pinchk         $pinchk
-dummypin               $dummypin
-dmodel         $dmodel
END

Execute program.

delaycalc.exec -rundir $shellgen_rundir -parmfile $cwd/$parmfiletmp
set result = $status
rm $parmfiletmp
exit $result
```

```
if( ! $?parmfile || $?args)then
   set parmfile = sim.parm
endif if( ! -f $parmfile)then
   if( $?interactive)then
      goto CASE1
   else if( ! $?args)then
      echo"No such parameter file.($parmfile)"
      exit 1
   endif
endif if( $?parm || $?interactive)then
   set sg_parameter = cat $parmfile
else if( $?args)then
   set sg argsflag = ($args)
   if( -f $parmfile)then
      set sg_parameter = cat $parmfile
      set sg_parameter = ($sg_parameter $args)
   else
      set sg_parameter = ($args)
   endif
endif set args =""
while($#sg_parameter)
   set shellgen_key = $sg_parameter[1]
   shift sg_parameter
   switch( $shellgen_key)
      case -dmod:
         set sg_dmod = ( $shellgen_key $sg_parameter[1])
         breaksw;
      default:
         set args = ($args $shellgen_key $sg_parameter[1])
   endsw
   shift sg_parameter
end
set sg_parameter = ( $args)

if( ! $?sg_dmod)then
   echo "Must be specified -dmod option."
   exit 1
else
   set sg_parameter = ( $sg_dmod $sg_parameter)
endif
          :
```

12

C1

F I G. 2 7

```
cat << END > sim.parm
-tool          $tool
-dmod          $dmod
-delaycntl              $delaycntl
-pinchk        $pinchk
-dummypin               $dummypin
-dmodel        $dmodel
END
    :
```

```
if('-f.global)then
   set gd_val = (lsi master package  ·····)
   set gd_key = (-lsi -master -package ·····)
   foreach val ( $gd_val)
      if( eval echo ¥$¥?$val )then
         set save_val = eval echo ¥$$val
      endif
      set $val = getvarfromgd $gd_key[1]
      if( eval echo ¥$$val == NULL )then
         if( $?save_val )then
            set $val = $save_val
            unset save_val
         else
            unset $val
         endif
      endif
      shift gd_key
   end
endif
    :

EXEC:

Updata gobal data

putvartoglobal -simdmodel $dmodel
putvartoglobal -simunit $dmod
    :
```

C3 groups the `if('-f.global)then` ... `endif` block.
C4 groups the `EXEC:` ... `putvartoglobal -simunit $dmod` block.

Label: 12

BATCH EXECUTION CONTROL PROGRAMMING DEVICE AND METHOD

BACKGROUND OF THE INVENTION

1. Field of the Invention

The present invention relates to a batch execution control programming device and method for executing, in batches, a tool to design an object such as a LEI by CAD.

2. Description of the Background Art

As a method for executing a CAD tool to design an object such as a LSI by CAD, there are a method for executing the CAD tool on a framework having the function of execution control and a user interface, and a method for executing the CAD tool according to the batch processing based on an execution control program that a programmer has created by using the batch program language, shell script and the like without using the user interface. Recently, a work for creating execution control programs to execute the same CAD tool according to the batch processing and a work for encapsulating a CAD tool to be executed on the framework into the framework have been performed separately.

FIG. 29 is a block diagram showing the structure of a device for encapsulating a tool into a framework according to the prior art. For example, the same tools for LSI design are encapsulated into a plurality of frameworks A, B, . . . for an electric system CAD which are provided by a plurality of vendors. The engineers who encapsulate tools prepare, in common, a common description D corresponding to the specification for tool encapsulation for the frameworks A, B, . . . irrespective of the language for tool encapsulation (extended language) which is exclusive to the frameworks A, B, . . . Processing systems Sa, Sb, . . . are prepared for the frameworks A, B, . . . , respectively, in advance. The processing systems Sa, Sb, . . . define processing procedures according to the functions of the frameworks A, B, . . . in such a manner that the frameworks A, B, . . . can perform tool encapsulating operation in accordance with the common description D. Consequently, if the engineer prepares a common description D for tool encapsulation, the encapsulation of the tools into the frameworks A, B, . . . can be implemented at the same time. Furthermore, if the specification for tool encapsulation is changed, the contents of the common description D are altered so that the frameworks A, B, . . . can be dealt with. Thus, maintenance work can be performed very easily. In addition, a predetermined description which is not related to the extended language for the frameworks A, B, . . . is enough for the common description D. Consequently, it is not necessary to understand the extended language.

FIG. 30 is a block diagram showing, in detail, the relationship among the common description D, one of the processing systems Sa, Sb, . . . and one of the frameworks A, B, . . . shown in FIG. 29. A processing system 2 is prepared for a framework 1 in advance. A user interface definition file 3, a parameter definition file 4 and an invocation command definition file 5 which have contents corresponding to the specification for tool encapsulation are prepared as the common description D. The processing system 2 has the function of reading the contents of the user interface definition file 3, the parameter definition file 4 and the invocation command definition file 5 and of implementing, on the framework 1, the same action as in the case where the specification for tool encapsulation is described by the extended language. Furthermore, an environment definition file 6 is provided in which it is determined whether the contents of processings of the user interface definition file 3, the parameter definition file 4 and the invocation command definition file 5 are executed according to the characteristics of the tool or not.

The user interface definition file 3, the parameter definition file 4 and the invocation command definition file 5 provide the description for defining the tool encapsulation specification dependent processing whose contents are varied according to the specification for tool encapsulation. The processing system 2 has a tool independent portion 2a and a tool dependent portion 2b. The tool independent portion 2a defines the framework function dependent processing whose contents are determined depending on only the function of the framework, and defines the procedure for causing the framework 1 to execute the framework function dependent processing. The tool dependent portion 2b defines the procedure for causing the framework 1 to execute the tool encapsulation specification dependent processing defined by the user interface definition file 3, the parameter definition file 4 and the invocation command definition file 5. The processing system 2 is applied to the framework 1 and the definition files 3 to 6 are provided to the processing system 2 so that the encapsulation of the tool into the framework 1 is implemented by one or more of the user interface definition file 3, the parameter definition file 4 and the invocation command definition file 5 specified for use by the environment definition file 6.

The environment definition file 6 provides the description for defining whether or not the user interface definition file 3, the parameter definition file 4 and the invocation command definition file 5 are used. FIG. 7 shows an example of the environment definition file 6.

As described above, the tool is encapsulated into the framework. A beginner who is not used to CAD operation had better perform execution by using the framework. However, an instructor or expert in CAD operation had better perform execution in batches so as to increase efficiency.

However, the knowledges of the execution control programming language and the program technique are necessary for batch execution control programming. For this reason, it takes time to create the program and it is hard for people other than those who developed a program to modify the program.

Thus, the execution processing using the framework and the execution processing performed according to the batch execution control program have advantages and disadvantages respectively. Accordingly, it is desired that both processings are used together.

Under the circumstances, however, the encapsulating processing into the framework and the batch execution control programming processing are performed for the same CAD tool entirely independent of each other. For this reason, the development and maintenance of respective processings should be performed. Consequently, a double load is imposed and the contents of operation make a difference in the stages of development and maintenance.

SUMMARY OF THE INVENTION

A first aspect of the present invention is directed to a batch execution control programming device for creating a batch execution control program which executes a tool for designing an object of design with CAD, comprising files for tool encapsulation which are used for encapsulation into a framework having the execution control function and a user interface, and provides a description for defining the contents of a processing of the tool, and a processing system for creating the batch execution control program based on the contents of a processing defined by the description of the file for tool encapsulation.

A second aspect of the present invention is directed to the batch execution control programming device, wherein the batch execution control program may have a user interface which is functionally equivalent to the contents of encapsulation into the framework.

A third aspect of the present invention is directed to the batch execution control programming device, wherein the files for tool encapsulation may have a plurality of files for tool encapsulation which give the descriptions for defining the contents of a plurality of processings respectively, further comprising a file for control which provides the description for defining the control information between the processings, and wherein the processing system may create a batch execution control program which can selectively execute one of the processings on the basis of the contents of the plurality of processings defined by the description of the files for tool encapsulation and the control information defined by the description of the file for control.

A fourth aspect of the present invention is directed to the batch execution control programming device, wherein the batch execution control program may utilize, during execution, a common execution information file which gives the description for defining common execution information shared by a plurality of tools for designing the object of design with CAD.

A fifth aspect of the present invention is directed to the batch execution control programming device, wherein the batch execution control program may have the function of generating a parameter file which gives the description for defining parameter information necessary for activating the tool that was used during past execution, and of utilizing the parameter information defined by the description of the parameter file during execution.

A sixth aspect of the present invention is directed to the batch execution control programming device, wherein the file for tool encapsulation may comprise a user interface definition file for providing the description which defines a user interface for acquiring predetermined information necessary for activating the tool from a user, a parameter definition file for providing the description which defines a parameter for transferring the predetermined information to the framework as tool invocation information, an activation command definition file for providing the description which defines the creation of a tool invocation command for defining the activation sequence of the tool, and an environment definition file for providing the description which specifies whether the user interface definition file, the parameter definition file and the invocation command definition file are used or not, and wherein the batch execution control program may be created by the specified ones of the user interface definition file, the parameter definition file and the invocation command definition file which should be used by providing the environment definition file to the processing system.

A seventh aspect of the present invention is directed to a method for creating a batch execution control program for executing a tool to design an object of design with CAD comprising the steps of (a) reading at least one file for tool encapsulation which is used for encapsulation of the tool into a framework having the execution control function and a user interface, and provides the description for defining the contents of a processing for the tool encapsulation, and (b) creating the batch execution control program based on the contents of a processing defined by the description of the file for tool encapsulation read at the step (a).

An eighth aspect of the present invention is directed to the method for creating a batch execution control program, wherein the batch execution control program may have a user interface which is functionally equivalent to the contents of encapsulation into the framework.

A ninth aspect of the present invention is directed to the method for creating a batch execution control program, wherein the file for tool encapsulation may have a plurality of files for tool encapsulation which give the description for defining the contents of a plurality of processings respectively, further comprising the step of (c) reading a file for control which provides the description for defining control information between the contents of processings, and wherein the step (b) is a step of creating a batch execution control program which can selectively execute one of the processings on the basis of the contents of processings defined by the description of the files for tool encapsulation read at the step (a) and the control information defined by the description of the file for control read at the step (c).

According to the first aspect of the present invention, the batch execution control programming device creates the batch execution control program based on the contents of the processing defined by the description of the files for tool encapsulation which is used for encapsulation into the framework having the execution control function and the user interface. Consequently, the batch execution control program can be automatically created without taking a lot of time when encapsulating the tool into the framework.

According to the second aspect of the present invention, the batch execution control program created by the batch execution control programming device has the user interface which is functionally equivalent to the contents of encapsulation into the framework. Consequently, the execution processing using the framework and the execution processing performed according to the batch execution control program can be effectively used together without causing a difference between the contents of the execution processing using the framework and the contents of the execution processing performed according to the batch execution control program.

According to the third aspect of the present invention, the processing system of the batch execution control programming device creates the batch execution control program which can selectively execute one of the processings based on the contents of the processings defined by the description of the files for tool encapsulation and the control information defined by the description of the file for control. Consequently, the batch execution control program which can correspond to the contents of the processings can be created more efficiently.

According to the fourth aspect of the present invention, the batch execution control program created by the batch execution control programming device can utilize, during execution, the common execution information file which provides the description for defining the common execution information which is shared by the contents of the processings. Consequently, it is possible to save time to newly input the common execution information when executing the batch execution control program.

According to the fifth aspect of the present invention, the batch execution control program created by the batch execution control programming device can generate the parameter file which provides the description for defining the parameter information necessary for activating the tool which was used during past execution, and can utilize the parameter information defined by the description of the parameter file during execution. Thus, it is possible to save time to newly input parameter information when executing the batch execution control program.

According to the sixth aspect of the present invention, the batch execution control programming device provides the environment definition file to the processing system to create the batch execution control program by the specified ones of the user interface definition file, the parameter definition file and the invocation command definition file which should be used. Consequently, it is possible to provide new files and to add, change and delete the contents of the description for the necessary ones of the user interface definition file, the parameter definition file and the invocation command definition file.

According to the seventh aspect of the present invention, at the step (b) of the method for creating a batch execution control program, the batch execution control program is created based on the contents of the processing defined by the description of the file for tool encapsulation which is used for encapsulation into the framework having the execution control function and the user interface. Consequently, the batch execution control program can be created without requiring new information when encapsulating the tool into the framework.

According to the eighth aspect of the present invention, the batch execution control program created by the method for creating a batch execution control program has the user interface which is functionally equivalent to the contents of encapsulation into the framework. Consequently, the execution processing using the framework and the execution processing performed according to the batch execution control program can be effectively used together without causing a difference between the contents of the execution processing using the framework and the contents of the execution processing performed according to the batch execution control program.

According to the ninth aspect of the present invention, at the step (b) of the method for creating a batch execution control program, the batch execution control program which can selectively execute one of the processings is created based on the contents of the processings defined by the description of the files for tool encapsulation and the control information defined by the description of the file for control. Thus, the batch execution control program which can correspond to the contents of the processings can be created more efficiently.

In order to solve the above problems, it is an object of the present invention to obtain a batch execution control programming device and method for creating a batch execution control program without taking time.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram showing an example of a user interface definition file;

FIG. 11 is a diagram showing an example of a batch execution control program result;

FIG. 12 is a diagram showing an example of a user interface definition file for a prelayout simulation;

FIG. 13 is a diagram showing an example of a user interface definition file for a postlayout simulation;

FIG. 14 is a diagram showing an example of a user interface definition file for a test simulation;

FIG. 18 is a diagram showing an example of a batch execution control program result for the prelayout simulation;

FIG. 19 is a diagram showing an example of a batch execution control program result for the postlayout simulation;

FIG. 20 is a diagram showing an example of a batch execution control program result for the test simulation;

FIG. 21 is a diagram showing an example of a control command file;

FIG. 22 is a diagram showing the contents of a batch execution control program;

FIG. 23 is a diagram showing the contents of the batch execution control program;

FIG. 24 is a diagram showing the contents of the batch execution control program;

FIG. 25 is a diagram showing the contents of the batch execution control program;

FIG. 26 is a diagram showing a portion related to a parameter file of the batch execution control program;

FIG. 27 is a diagram showing a portion related to the parameter file of the batch execution control program;

FIG. 28 is a diagram showing a portion related to a common execution information file of the batch execution control program;

DESCRIPTION OF THE PREFERRED EMBODIMENTS

<First Embodiment>

Figure 1:
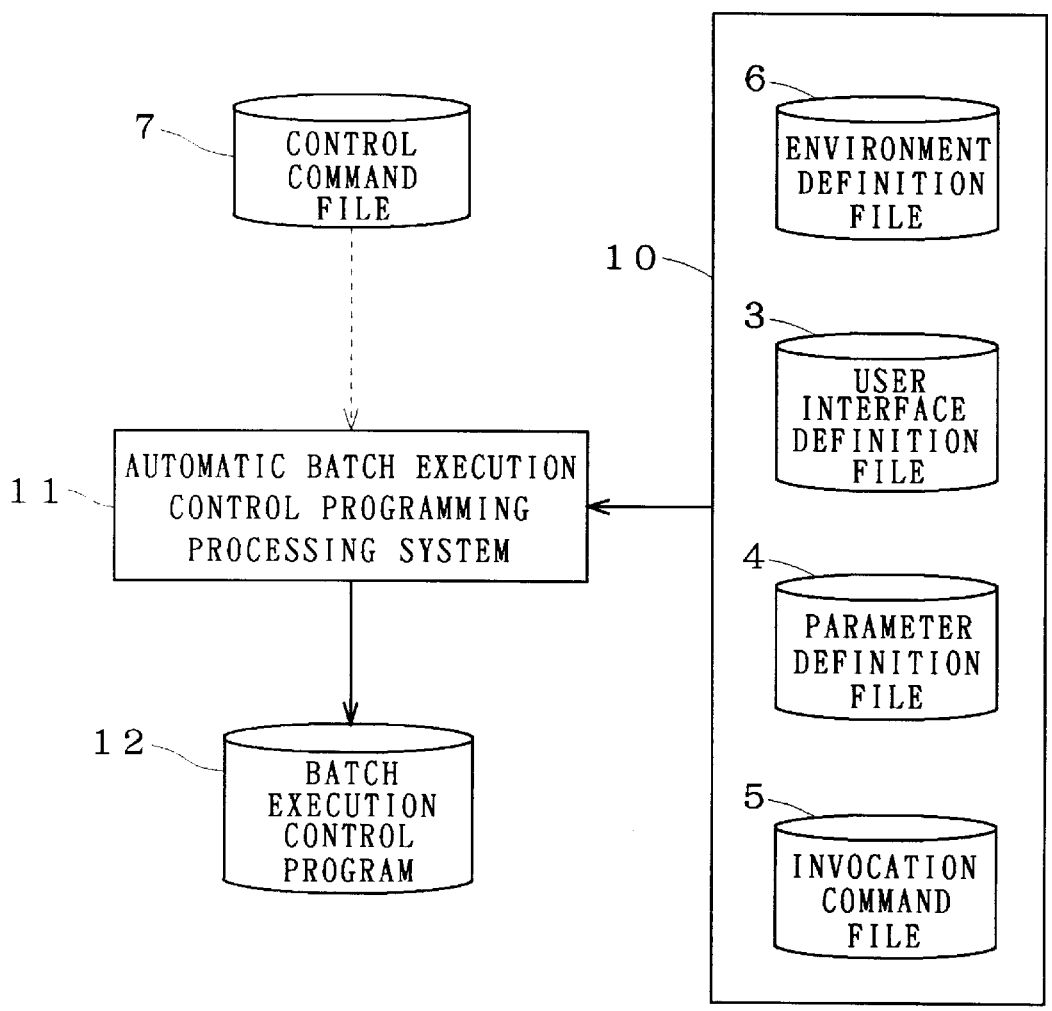
FIG. 1 is a block diagram showing the structure of an automatic batch execution control programming device according to a first embodiment of the present invention.
Figure 2:
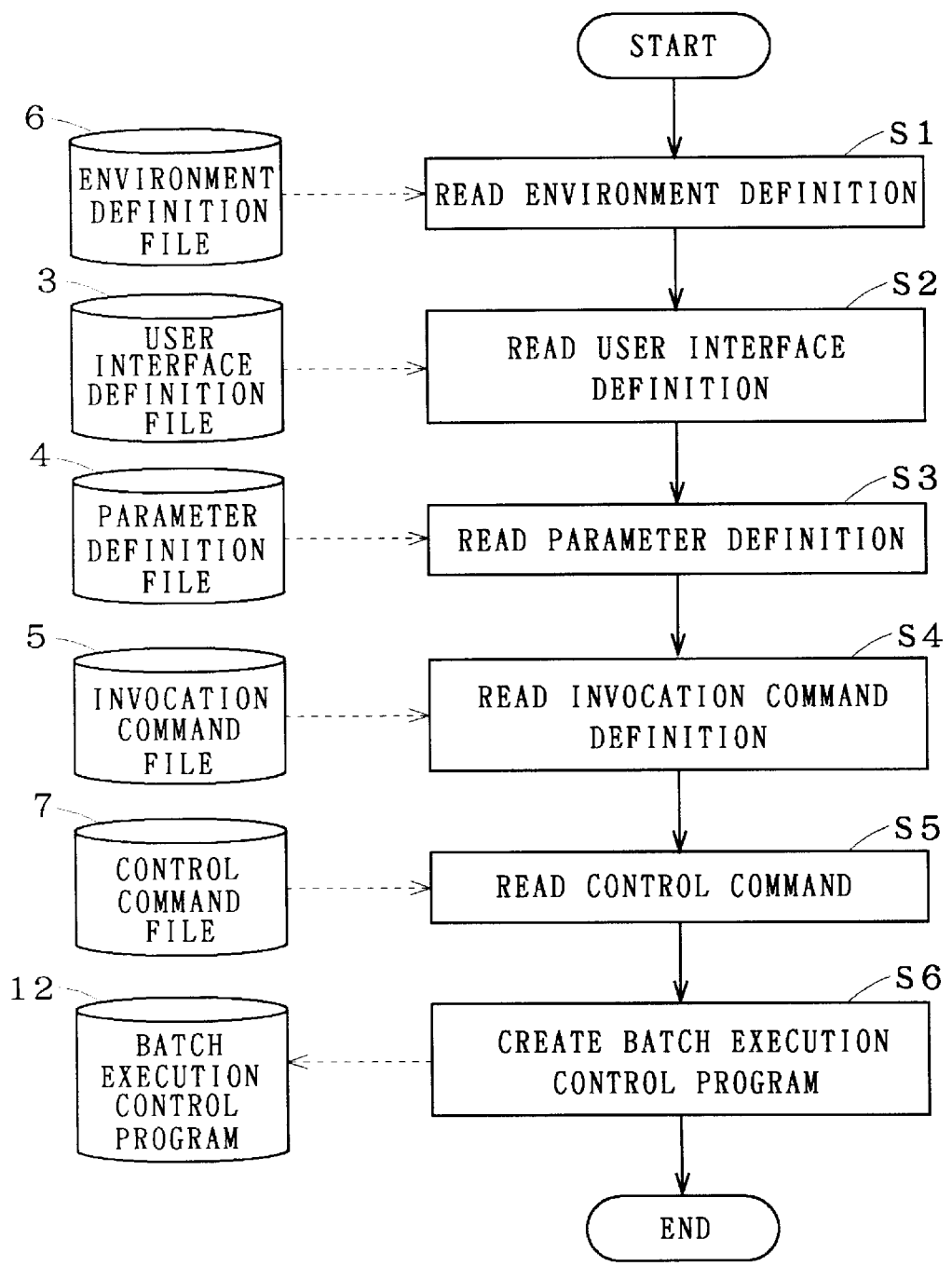
FIG. 2 is a flowchart showing a batch execution control programming method according to the first embodiment of the present invention.

FIG. 1 is a block diagram showing the structure of an automatic batch execution control programming device according to a first embodiment of the present invention. FIG. 2 is a flowchart showing a batch execution control programming method according to the first embodiment of the present invention.

As shown in FIG. 1, a processing system 11 reads a common definition files 10 which comprises an environment definition file 6, a user interface definition file 3, a parameter definition file 4 and an invocation command definition file 5, and a control command file 7, and generates a batch execution control program 12.

The user interface definition file 3, the parameter definition file 4 and the invocation command definition file 5 provide the description for defining the contents of the process of tool encapsulation which are changed depending on the specification for tool encapsulation. The environment definition file 6 provides the description for defining whether the contents of the processings of the user interface definition file 3, the parameter definition file 4 and the invocation command definition file 5 are executed according to the characteristics of a tool or not.

The batch execution control programming method according to the first embodiment will be described below with reference to FIG. 2.

Figures 6, 7:
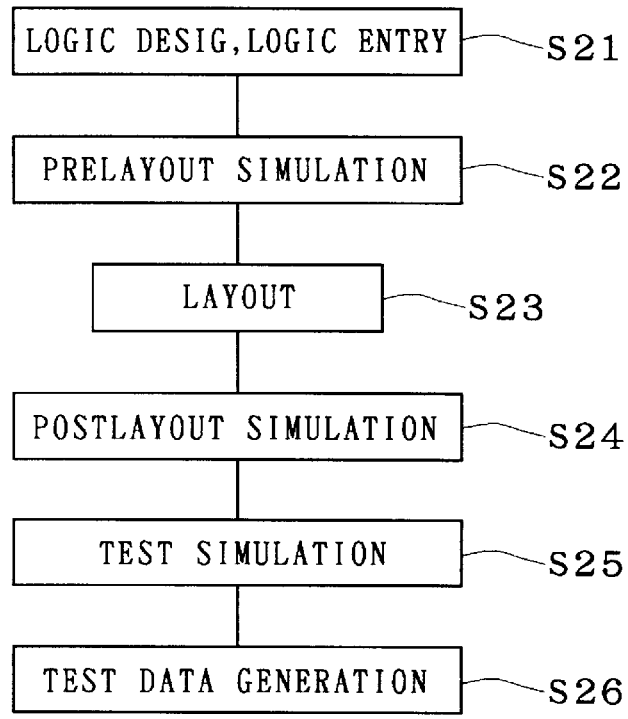
FIG. 6 is a flowchart showing the flow of the general LSI design processing.
FIG. 7 is a diagram showing an example of an environment definition file.

In Step S1, the processing system 11 reads the environment definition file 6. The environment definition file 6 provides the description for defining that the user interface definition file 3, the parameter definition file 4, and the invocation command definition file 5 are used or not. FIG. 7 shows an example of the environment definition file 6. In the environment definition file 6 of FIG. 7, "EncapFormDef=" is followed by a user interface definition file name. "EncapParmDef=" is followed by a parameter definition file name. "EncapInvokeDef=" is followed by an invocation command definition file name. "EncapLogFile=" is followed by a log file name. In addition, there are a tool execution directory, a tool execution node, a tool execution priority and the like.

In Step S2, the processing system 11 reads the user interface definition file 3. FIG. 8 shows an example of the user interface definition file 3.

The contents defined in the user interface definition file 3 are (1) the list order of fields, (2) the type of the field (characters/integers and the like), (3) characteristics for each field (a prompt, only display and the like). (4) the checking function for each field, and (5) a mechanism for communication with frameworks.

1 field starts at "("and ends at ")". The list order of fields of (1) may be displayed in order of field description. The head may be a title field and the following may be description for each field type. As the field type (characters/integers and the like) of (2), there is "string, file, . . . , boolean". As the characteristics for each field (a prompt, only display and the like) of (3), there is "editable nil" which indicates "only display". As the checking function for each field of (4), there is, for example, "? range" which checks that a numeric value within the specified range (0, 10) is input or not. The mechanism for information interchange with frameworks of (5) will be described in the following explanation of the parameter definition file 4.

In Step S3, the processing system 11 reads the parameter definition file 4. The parameter definition file 4 defines a method for creating the parameter file of a tool (shell script).

Figure 9:
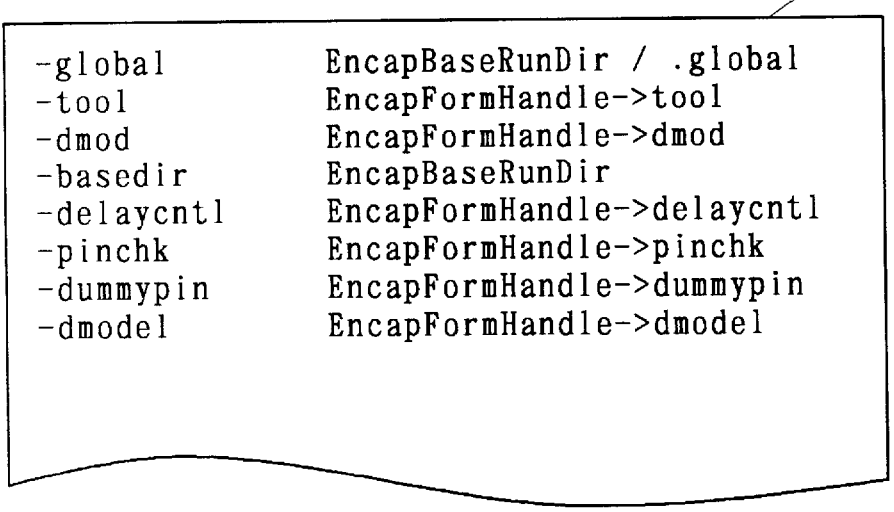
FIG. 9 is a diagram showing an example of a parameter definition file.

A template for the contents to be written to the parameter file of the tool (shell script) is described in the parameter definition file 4. The shell script is a command sequence which is generally provided by a typical framework operating system UNIX. FIG. 9 shows an example of the parameter definition file 4.

As shown in FIG. 9, the parameter definition file 4 describes the keywords of the parameters of the tool, i.e., "-tool", . . . , "-dmodel" as they are. The residual description is used for the reference of values. "EncapFormHandle ->dmod" is the reference for utilizing a form pointer. "EncapFormHandle" indicates a form name, and "dmod" indicates a field name. Thus, the value of the "dmod" field of the form is referred to.

Figure 10:
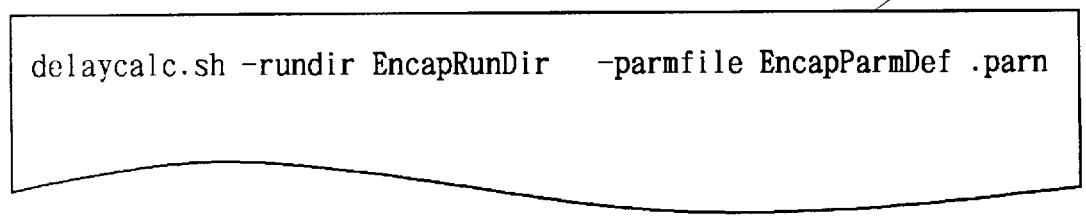
FIG. 10 is a diagram showing an example of an invocation command definition file.

In Step S4, the processing system 11 reads the invocation command definition file 5. FIG. 10 shows an example of the invocation command definition file 5.

The invocation command definition file 5 defines the invocation sequence of the tool (shell script). In the invocation command definition file 5 of FIG. 10) "EncapRunDir" indicates a tool execution directors and "EncapParmDef" indicates a parameter definition file name. The shell script is executed in accordance with the command sequence. In order to actually provide the parameter file created in accordance with the definition of the parameter definition file 4 to the tool, tool invocation is described by the shell script so that all argument information can he transferred to the tool. In other words, interfacing with the tool is performed based on data for the file invocation arguments. In the case where the actual tool does not require these arguments but another data format, it is invocated on the shell script to create necessary data or the like in the shell script.

The processing system 11 reads the control command file 7 in Step S5, and creates the batch execution control program 12 in Step S6. Examples of the control command file 7 and the batch execution control program 12 will be described in a second embodiment.

Figure 16:
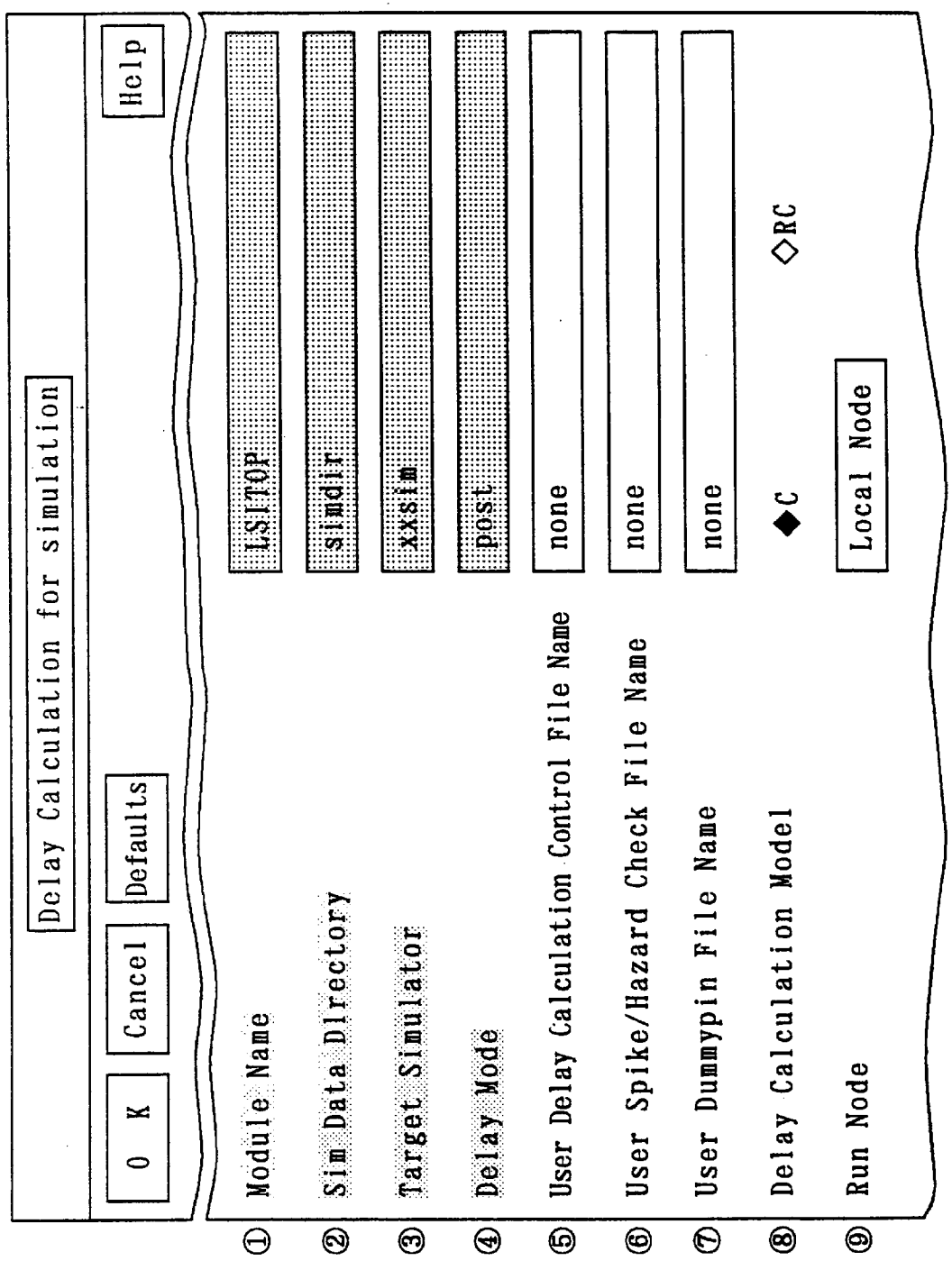
FIG. 16 is a diagram showing an example of the form of a framework for the postlayout simulation.

FIG. 11 is a diagram showing an example of a batch execution control program result 13 obtained by executing the batch execution control program 12. FIG. 16 is a diagram showing an example of the form of a framework 1. The relationship between the user interface definition file 3, and the form of the framework 1 and the batch execution control program result 13 will be described below with reference to FIGS. 8, 11 and 16.

For convenience of explanation, the fields of the user interface definition file 3 are numbered from ① to ⑨. Field ① of FIG. 8 corresponds to ① of FIG. 16 for the form of the framework 1, and to ① of FIG. 11 for the batch execution control program result 13.

In FIG. 8, ① to ④ have the description of "? editable nil". When "? value" is a character string ('xxsim' of ③ and 'post' of ④), it is used. When "? value" is gd_xx (gd_module of ① and gd_simdir of ②), a value input by a job which was executed last time is used. In other words, it is indicated that only display is performed and the user's specification is not necessary (values cannot be changed). In the form of the framework 1 shown in FIG. 16, input fields are only displayed by meshes. In the batch execution control program result 13 shown in FIG. 11, the values of fields are displayed after "* Read only field*".

A user specifies the values of fields ⑤ to ⑨. In the batch execution control program result 13 shown in FIG. 11, the fields ⑤ to ⑧ are displayed after "* Please input field data *". A value defined in "? value" is displayed as a default of the field. As an example of ⑤, "none" is displayed in the input field in the form of the framework 1 shown in FIG. 16. In the batch execution control program result 13, "User Delay Calculation Control File Name (Previous Value: none)" is displayed.

Figure 3:
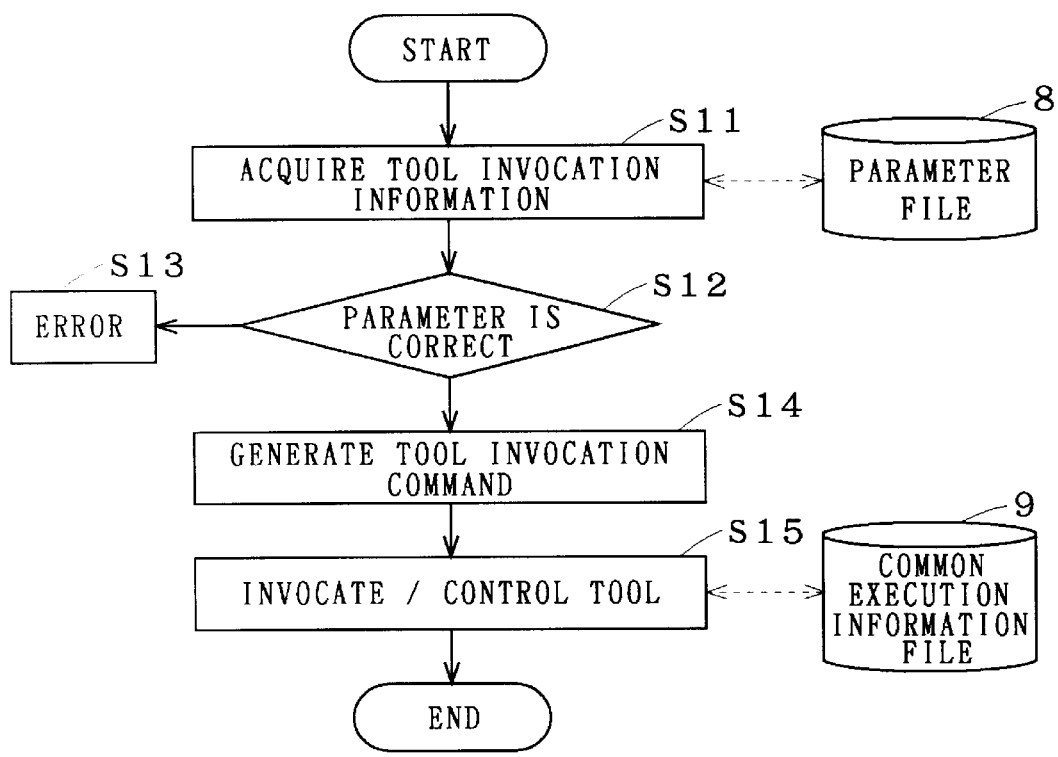
FIG. 3 is a flowchart showing the contents of the basic processing of a batch execution control program.

FIG. 3 is a flowchart showing the contents of the basic processing of the batch execution control program 12. Step S11 is a step of the user interface for acquiring tool invocation information. The processing of Step S11 is executed in a portion created based on the information obtained from the user interface definition file 3 which has been read in Step S2 shown in FIG. 2 in the batch execution control program 12. In order to acquire information necessary for invocating the tool, there are a method for acquiring the necessary information interactively, a method for specifying the necessary information as an argument during batch shell invocation, and a method for preparing, in advance, a file including the information necessary for invocation and for specifying the same file. In this case, the information necessary for invocating the tool specified by the user is retained in a parameter file 8. On and after the second execution, the information is read from the parameter file 8 and is used as a default value. In the example of FIG. 8, "none" of "? value" defines that there is no default value. In the execution of the batch execution control program 12, a value which was specified last time is retained in the parameter file 8 and the value read from the parameter file 8 is displayed as the default value.

FIGS. 26 and 27 show portions related to the parameter file 8 of the batch execution control program 12. As shown in C1 of FIG. 26, description given after "if (-f. $parmfile) then" designates the data read from parmfile corresponding to the parameter file 8. As shown in C2 of FIG. 27, the specified value is written to the parameter file 8.

In Step S12, it is checked that information such as a parameter input by the user is correct or not. The processing of Step S12 is executed in a portion which is created based on the information read in Step S2 of FIG. 2 in the batch execution control program 12.

If the check of Step S12 decides that the information is not correct, the routine proceeds to Step S13 where an error processing is performed, for example. If the check of Step S12 decides that the information is correct, the routine proceeds to Step S14 where an invocation command for actually invocating a tool is generated from the data input in Step S11. The processing of Step S14 is executed in a portion which is created based on the parameter definition file 4 read in Step S3 of FIG. 2 in the batch execution control program 12.

In Step S15, the invocation command generated in Step S14 is invoked to control the execution of the tool. The processing of Step S15 is executed in a portion which is created based on the activation command definition file 5 read in Step S4 of FIG. 2 in the batch execution control program 12. In this execution common information is acquired from a common execution information file 9 which holds execution information that is shared by CAD tools executed at each step of design among information necessary for tool invocation. The common information specified by the user is written to the common execution information file 9.

For example, the definition "? global" of the user interface definition file 4 indicates a global variable which is shared by the CAD tools. The input value can be held by the common execution information file 9 and transferred in the CAD tools. The global variables are classified depending on the global range. By way of example, "gd_xx" indicates a global variable which is common to all CAD tools of a design system for LSI design, and "gv_xx" indicates a global variable which is common at each step of the design, for example, only in a simulation. In (8) of FIG. 8, "global" "gv_simdmodel" is defined and indicates a global variable which is used in common only in the simulation.

FIG. 28 is a diagram showing a portion related to the common execution information file 9 of the batch execution control program 12. As shown in C3 of FIG. 28, the description given after "if (-f. global) then" designates the reading of the global variable from a global file corresponding to the common execution information file 9. As shown in C4 of FIG. 28, the global variable is written to the common execution information file 9.

Figure 4:
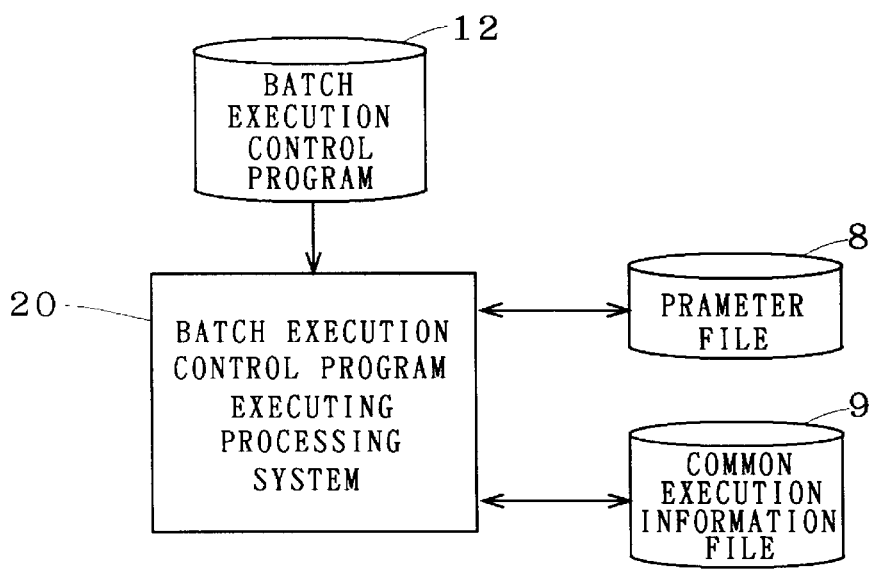
FIG. 4 is a block diagram showing the structure of a device for executing a batch execution control program according to the first embodiment of the present invention.

FIG. 4 is a block diagram showing the structure of a device for executing a batch execution control program which implements the processing shown in FIG. 3. As shown in FIG. 4, a batch execution control program executing processing system 20 executes the batch execution control program 12 while creating and referring to the parameter file 8 and the common execution information file 9 based on the batch execution control program 12.

Thus, the batch execution control programming device according to the first embodiment can automatically create the batch execution control program 12 by using files comprising the environment definition file 6, the user interface definition file 3, the parameter definition file 4 and the invocation command definition file 5 which are used when encapsulating the tool into the framework 1. Accordingly, the batch execution control program 12 can be automatically created without adding new information and without taking time when encapsulating the tool into the framework 1.

The batch execution control program 12 is created based on the same files 3 to 6 as that for encapsulation into the framework 1. Consequently, the hatch execution control program 12 which is entirely equivalent to the contents of the encapsulation of the tool into the framework 1 can be created.

As a result, the execution processing using the framework and the execution processing performed according to the batch execution control program can he effectively used together without causing a difference between the contents of the execution processing using the framework 1 and those of the execution processing performed according to the batch execution control program 12 in the stages of development and maintenance.

The batch execution control program created by the batch execution control programming device according to the first embodiment can utilize the common execution information file 9 that holds global variables which are shared by the CAD tools. Consequently, it is possible to save a lot of time to newly input the common execution information such as global variables when executing the batch execution control program 12.

The batch execution control program 12 created by the batch execution control programming device according to the first embodiment Generates the parameter file 8 for providing the description which defines parameter information necessary for invocating the tool that was used during past execution, and utilizes the parameter information defined by the description of the parameter file 8 during execution. Consequently, it is possible to save a lot of time to newly input parameter information when executing the batch execution control program 12.

According to the batch execution control programming device according to the first embodiment, furthermore, the environment definition file 6 is provided to the processing system 11 so that the batch execution control program 12 is created by the specified ones of the user interface definition file 3, the parameter definition file 4 and the invocation command definition file 5 which should be used. Consequently, it is possible to provide new files and to add, change and delete the contents of the description for the necessary ones of the user interface definition file 3, the parameter definition file 4 and the activation command definition file 5.

<Second Embodiment>

Figure 5:
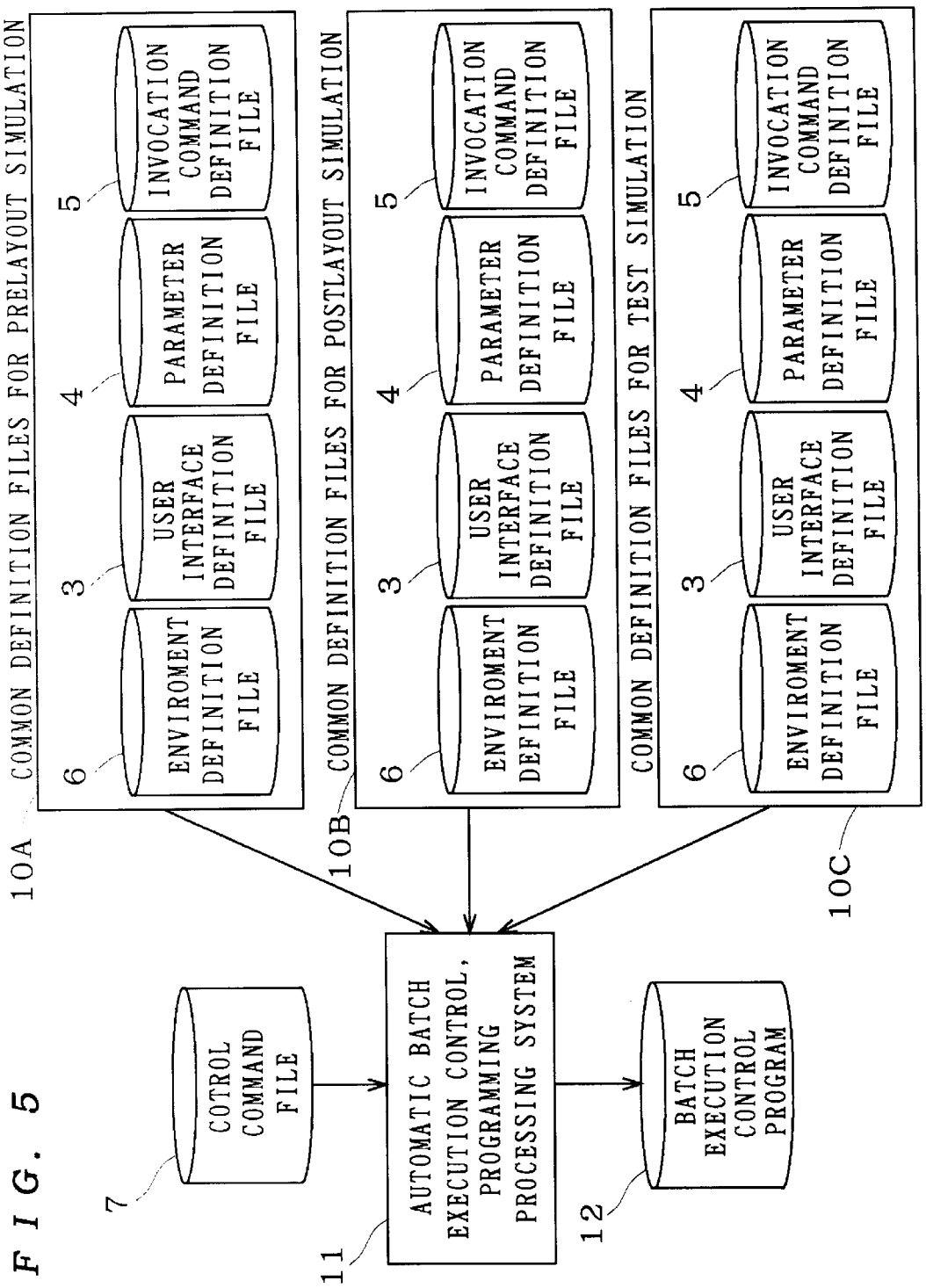
FIG. 5 is a block diagram showing the structure of an automatic batch execution control programming device according to a second embodiment of the present invention.

FIG. 5 is a block diagram showing the structure of an automatic batch execution control programming device according to a second embodiment of the present invention.

As shown in FIG. 5, a processing system 11 reads environment definition files 6, user interface definition files 3, parameter definition files 4 and invocation command definition files 5 of common definition files for a prelayout simulation 10A, common definition files for a postlayout simulation 10B and common definition files for a test simulation 10C, and generates a batch execution control program 12 which can be utilized in common in the three simulations described above.

As shown in FIG. 6, the LSI design flow generally passes through a logic design and a logic design entry process S21, a prelayout simulation process S22, a layout process S23, a postlayout simulation process S24, a test simulation process S25 and a test data creating process S26.

Thus, it is necessary to execute a simulation three times, i.e., the prelayout simulation, the postlayout simulation and the test simulation for the same circuit when usually performing LSI design. In the case where such simulations are encapsulated into a framework, it is necessary to encapsulate the three simulations independently because the user interface is varied. Accordingly, three kinds of common definition files 10A to 10C are independently prepared for the prelayout simulation, the postlayout simulation and the test simulation.

Figure 15:
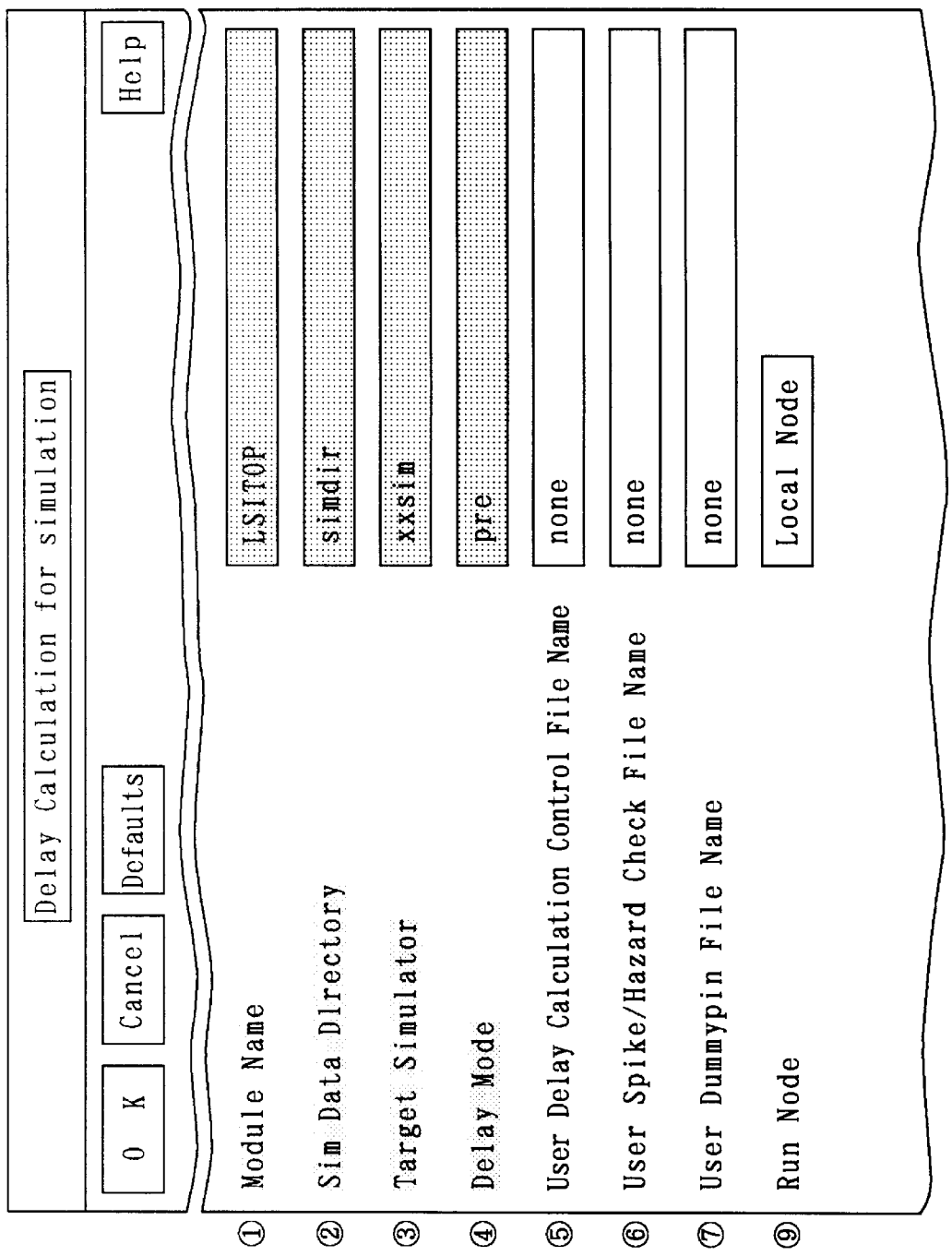
FIG. 15 is a diagram showing an example of the form of a framework for the prelayout simulation.
Figure 17:
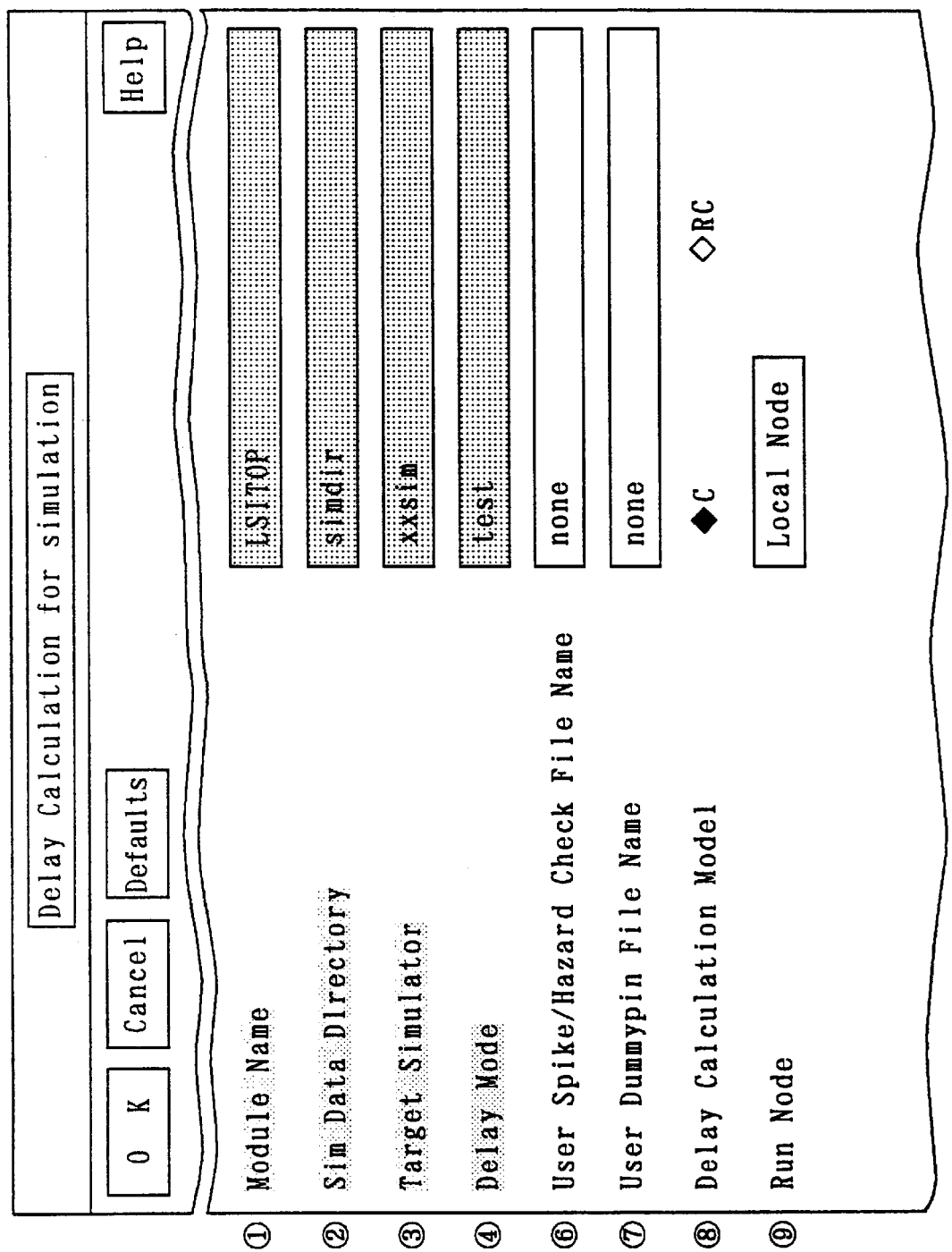
FIG. 17 is a diagram showing an example of the form of a framework for the test simulation.
Figure 29:
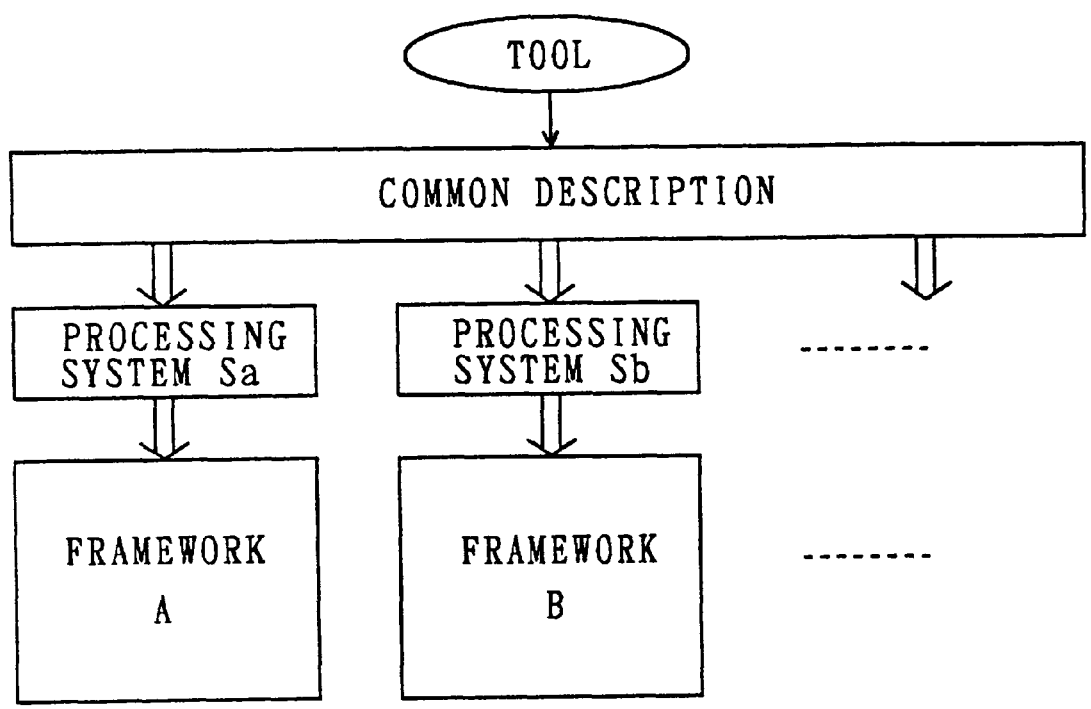
FIG. 29 is a block diagram showing an example of a tool encapsulating device according to the prior art.
Figure 30:
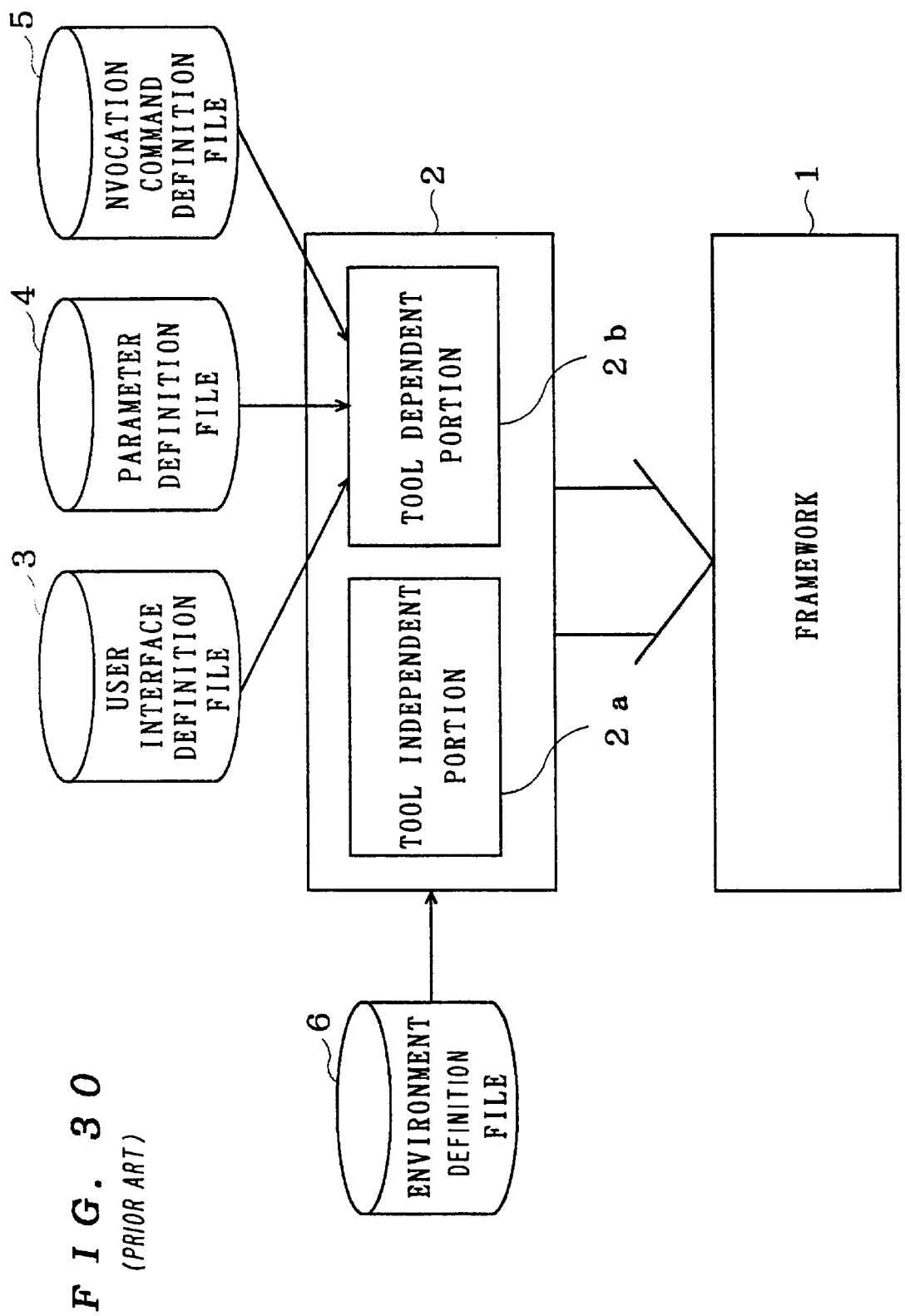
FIG. 30 is a block diagram showing a processing system of the tool encapsulating device according to the prior art.

FIGS. 12 to 14 show user interface definition files 3A to 3C for the prelayout simulation, the postlayout simulation and the test simulation respectively. FIGS. 15 to 17 show the forms of a framework 1 for the simulations.

For the prelayout simulation, fields ① to ⑦ and ⑨ of FIG. 12 correspond to ① to ⑨ and ⑨ of FIG. 15. For the postlayout simulation, fields ① to ⑨ of FIG. 13 correspond to ① to ⑨ of FIG. 16. For the test simulation, fields ① to ④ and ⑥ to ⑨ of FIG. 14 correspond to ① to ④ and ⑥ to ⑨ of FIG. 17. Thus, three kinds of simulations are encapsulated into the framework 1 in the same LSI design stage.

The processing system 11 generates the batch execution control program 12 which can be shared for the prelayout simulation, the postlayout simulation and the test simulation on the basis of control information among the three simulations which are defined by the description of the common definition files 10A to 10C and a control command file 7.

The batch execution control program 12 is executed in such a manner that only necessary information is required to be input in each simulation mode of prelayout, postlayout and test. The simulation mode is determined by user's input. Hereinafter, the prelayout simulation mode, the postlayout simulation mode and the test simulation mode will be referred to as the pre mode, the post mode and the test mode.

When the user interface definition files 3A to 3C of each mode shown in FIGS. 12 to 14 are compared with one another, it is apparent that all fields ① to ⑧ are present in the post mode, "dmodel" of the field ⑧ is not present in the pre mode, and "delaycntl" of the field ⑤ is not present in the test mode.

In order to control the simulation mode, the control command file 7 is defined as shown in FIG. 21. First of all, "declare dmod" is described so that "dmod" which is set by a field "Delay Mode" as a conditional key is specified. "dmod" is a variable which indicates the simulation mode. "pre", "post" and "test" are used for the pre mode, the post mode and the test mode respectively.

The field names which are controlled based on the variable "dmod" will be described below. A control statement is defined for the field name (handle name) "delaycntl" and "dmodel". In a field "delaycntl", it is defined that input is required by batch execution when the value of "dmod" is equal to "pre" or "post". In a field "dmodel", it is defined that input is required by batch execution when the value of "dmod" is equal to "post" or "test". In fields "pinchk" and "dummypin", it is defined that input is required when the value of "dmod" is equal to "pre", "post" or "test", i.e., in all modes. In the fields which are not described, any value of the variable "dmod" is required to be input.

FIGS. 22 to 25 show the contents of the batch execution control program 12. Fields ① to ⑧ of FIG. 13 (FIGS. 12 and 14) correspond to ① to ⑧ of FIG. 22 to 25. As shown in FIGS. 22 to 25, a field ③ dmod of FIG. 13 which acts as a conditional key for controlling the simulation mode corresponds to ④ of FIG. 22, either of "pre", "post" and "test" is specified as "dmod". In the field ⑤ of FIG. 22, it is apparent, from the description given after "if ($dmod==pre||$dmod==post) then", that the display to urge a user to execute specification is performed when the prelayout simulation (pre) and the postlayout simulation (post) are specified, and the above display is not performed when the test simulation (test) is specified. In the field ⑧, it is apparent, from the description given after "if ($dmod==post||$dmod==test) then", that the display to urge the user to execute specification is performed when the postlayout simulation (post) and the test simulation (test) are specified, and the above display is not performed when the prelayout simulation (pre) is specified.

In FIG. 24, C11 is a portion for user input data display, for example, a portion which performs display after "* Please check your input data*" in FIG. 11. ① to ⑧ and C11 correspond to Steps S11 to S13 shown in FIG. 3. In FIG. 25, C12 and C13 are programs which correspond to the processings of Steps S14 and S15 shown in FIG. 3 respectively.

FIGS. 18 to 20 show a batch execution control program result 13 which is obtained by the execution in the pre mode, the post mode and the test mode of the batch execution control program 12. In the pre mode, fields ① to ⑦ of FIG. 12 correspond to ① to ⑦ of FIG. 18. In the post mode, fields ① to ⑧ of FIG. 13 correspond to ① to ⑧ of FIG. 19. In the test mode, fields ① to ④ and ⑥ to ⑧ of FIG. 14 correspond to ① to ④ and ⑥ to ⑧ of FIG. 20.

As shown in FIGS. 18 to 20, either of "pre", "post" and "test" is specified as "dmod" in "Delay Mode" of the field ④. When "pre" is set as "dmod", "Delay, Calculation Model" of the field ④ is not required to be input as shown in FIG. 18. When "test" is set as "dmod", "User Delay Calculation Control File Name" of the field ⑤ is not required to be input as shown in FIG. 20.

The structure of the execution processing system of the batch execution control program 12 and the contents of the processing thereof are the same as those of the execution processing system 20 according to the first embodiment shown in FIGS. 3 and 4.

Thus, the batch execution control programming device according to the second embodiment can automatically create the batch execution control program 12 which can be shared in three modes based on three files 8 (which have the environment definition files 6, the user interface definition files 3, the parameter definition files 4 and the invocation command definition files 5 respectively) corresponding to the simulations of the three modes (the pre mode, the post mode and the test mode) respectively and the control command file 7 in which the control information for each simulation mode is described.

When the batch execution control program 12 created in the second embodiment is executed, three kinds of simulations can be executed in accordance with the batch execution control program 12 by requiring the user to input the simulation mode and setting "dmod" based on an input request.

Accordingly, the second embodiment has a good effect that the batch execution control program 12 which can selectively execute one of the three simulation modes can be created more efficiently in addition to the effects of the first embodiment.

While the invention has been described in detail, the foregoing description is in all aspects illustrative and not restrictive. It is understood that numerous other modifications and variations can be devised without departing from the scope of the invention.

I claim:

1. A batch execution control programming device for creating a batch execution control program which executes a software tool for designing an object of design by CAD, comprising:

files for tool encapsulation which are used for encapsulation of said software tool into a framework having an execution control function and a user interface and which provide descriptions for defining the contents of a processing of said software tool; and a processing system for creating said batch execution control program based on said contents of a processing defined by the descriptions of said files for tool encapsulation.

2. The batch execution control programming device as defined in claim 1, wherein said batch execution control program has a user interface which is functionally equivalent to the contents of tool encapsulation into said framework.

3. The batch execution control programming device as defined in claim 2, wherein said files for tool encapsulation comprise a plurality of files for tool encapsulation which give the description for defining the contents of a plurality of processings respectively, further comprising:

a file for control which provides the description for defining the control information between said processings, and wherein said processing system creates a batch execution control program which selectively executes one of said processings on the basis of said contents of said plurality of processings defined by the description of said files for tool encapsulation and said control information defined by the description of said file for control.

4. The batch execution control programming device as defined in claim 2, wherein said files for tool encapsulation comprises:

a user interface definition file for providing the description which defines a user interface for acquiring information necessary for invocating said software tool from a user;

a parameter definition file for providing the description which defines a parameter for transferring said information to said framework as tool invocation information;

an invocation command definition file for providing the description which defines the creation of a tool invocation command for defining the invocation sequence of said software tool; and an environment definition file for providing the description which specifies whether said user interface definition file, said parameter definition file and said invocation command definition file are used or not; and wherein said batch execution control program is created by the specified ones of said user interface definition file, said parameter definition file and said invocation command definition file which should be used by providing said environment definition file to said processing system.

5. The batch execution control programming device as defined in claim 1, wherein said batch execution control program utilizes, during execution, a common execution information file which gives the description for defining common execution information shared by a plurality of software tools for designing the object of design with CAD.

6. The batch execution control programming device as defined in claim 1, wherein said batch execution control program has the function of generating a parameter file which gives the description for defining parameter information necessary for invocating the software tool that was used during past execution, and of utilizing said parameter information defined by the description of said parameter file during execution.

7. The batch execution control programming device as defined in claim 1, wherein said files for tool encapsulation comprise a plurality of files for tool encapsulation which give the description for defining the contents of a plurality of processings respectively, further comprising:

a file for control which provides the description for defining the control information between said processings, and wherein said processing system creates a batch execution control program which selectively executes one of said processings on the basis of said contents of said plurality of processings defined by the description of said files for tool encapsulation and said control information defined by the description of said file for control.

8. A method for creating a batch execution control program for executing a software tool to design an object of design by CAD, comprising the steps of:

(a) reading files for tool encapsulation which are used for encapsulation into a framework having an execution control function and a user interface, and which provide descriptions for defining the contents of a processing for said tool encapsulation; and (b) creating said batch execution control program based on said contents of a processing defined by the descriptions of said files for tool encapsulation read at said step (a).

9. The method for creating a batch execution control program as defined in claim 8, wherein said batch execution control program has a user interface which is functionally equivalent to the contents of tool encapsulation into said framework.

10. The method for creating a batch execution control program as defined in claim 9, wherein said files for tool encapsulation comprise a plurality of files for tool encapsulation which give the description for defining the contents of a plurality of processings respectively, further comprising the step of:

(c) reading a file for control which provides the description for defining control information between said contents of processings, and wherein said step (b) is a step of creating a batch execution control program which selectively executes one of said processings on the basis of said contents of processings defined by the description of said files for tool encapsulation read at said step (a) and said control information defined by the description of said file for control read at said step (c).

11. The method for creating a batch execution control program as defined in claim 8, wherein said files for tool encapsulation comprise a plurality of files for tool encapsulation which give the description for defining the contents of a plurality of processings respectively, further comprising the step of:

(c) reading a file for control which provides the description for defining control information between said contents of processings, and said step (b) is a step of creating a batch execution control program which selectively executes one of said processings on the basis of said contents of processings defined by the description of said files for tool encapsulation read at said step (a) and said control information defined by the description of said file for control read at said step (c).

\* \* \* \* \*